(12) United States Patent
Toyama et al.

(10) Patent No.: US 7,981,746 B2
(45) Date of Patent: Jul. 19, 2011

(54) SEMICONDUCTOR DEVICE AND METHOD FOR MANUFACTURING THEREOF

(75) Inventors: Fumiaki Toyama, Fukushima-ken (JP); Fumihiko Inoue, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 392 days.

(21) Appl. No.: 12/341,874

(22) Filed: Dec. 22, 2008

(65) Prior Publication Data
US 2009/0321812 A1   Dec. 31, 2009

(30) Foreign Application Priority Data

Dec. 20, 2007  (JP) .................................. 2007-328796

(51) Int. Cl.
*H01L 21/336* (2006.01)
(52) U.S. Cl. ... 438/264; 438/263; 438/270; 257/E21.68; 257/E21.422; 257/E21.179
(58) Field of Classification Search ........................ None
See application file for complete search history.

(56) References Cited

U.S. PATENT DOCUMENTS

2009/0315098 A1 * 12/2009 Toyama et al. ............... 257/324

* cited by examiner

*Primary Examiner* — Jarrett J Stark

(57) ABSTRACT

The present invention provides a semiconductor device including a semiconductor substrate provided with a trench section; a tunnel insulating film covering an inner surface of the trench section; a trap layer provided in contact with the tunnel insulating film on an inner surface of an upper portion of the trench section; a top insulating film provided in contact with the trap layer; a gate electrode embedded in the trench section, and provided in contact with the tunnel insulating film at a lower portion of the trench section and in contact with the top insulating film at the upper portion of the trench section, in which the trap layer and the top insulating film, in between the lower portion of the trench section and the upper portion of the trench section, extend and protrude from both sides of the trench section so as to be embedded in the gate electrode, and a method for manufacturing thereof.

13 Claims, 14 Drawing Sheets

SEMICONDUCTOR DEVICE AND METHOD FOR MANUFACTURING THEREOF

CROSS REFERENCE TO RELATED APPLICATIONS

This application claims the priority benefit of JP Application No. 2007-328796, filed Dec. 20, 2007, which is hereby incorporated in its entirety.

FIELD OF THE INVENTION

The present invention relates to a semiconductor device and a method for manufacturing thereof, and more particularly to a semiconductor device having charge storage layers on both sides of a trench section and a method for manufacturing thereof.

BACKGROUND OF THE INVENTION

Recently, non-volatile semiconductor memory devices capable of retaining data even when the power is turned off have been widely used. In a typical non-volatile flash memory device, a transistor which constitutes a memory cell has a floating gate or an insulating film which is called a charge storage layer. Data is stored by accumulating electric charges in the charge storage layer. The flash memory with the insulating film as the charge storage layer has a SONOS (Silicon Oxide Nitride Oxide Silicon) structure where the charge is accumulated in the charge storage layer inside the ONO (oxide film/nitride film/oxide film) film.

Further, a virtual ground flash memory device stores multiple bits of information in the ONO film of a single memory cell by switching a source region and a drain region formed in the semiconductor substrate. In the virtual ground flash memory, the effective channel length must be long enough to avoid a complementary bit disturb (CBD) in which multiple bits in the ONO film interfere. Consequently, miniaturization becomes difficult. A flash memory provided with a trench section in the semiconductor substrate, and an ONO film formed on both side faces of the trench section has been developed. Since a channel is formed along the trench section, CBD can be prevented and miniaturization realized.

SUMMARY

According to an aspect of the present invention, there is provided a semiconductor device including: a semiconductor substrate provided with a trench section; a tunnel insulating film covering an inner surface of the trench section; a trap layer provided in contact with the tunnel insulating film on an inner surface of an upper portion of the trench section; a top insulating film provided in contact with the trap layer; and a gate electrode embedded in the trench section, and provided in contact with the tunnel insulating film at a lower portion of the trench section and in contact with the top insulating film at the upper portion of the trench section. The trap layer and the top insulating film, in between the lower portion of the trench section and the upper portion of the trench section, extend and protrude from both sides of the trench section so as to be embedded in the gate electrode. When manufacturing the semiconductor device according to this aspect, as the trap layer is not exposed to etching for separating the trap layer in the trench section, incidence of damage to the trap layer can be reduced.

According to another aspect of the present invention, there is provided a method for manufacturing a semiconductor device including: forming a trench section in a semiconductor substrate; forming a tunnel insulating film that covers an inner surface of the trench section; forming a first conductive layer in the trench section so as to be in contact with the tunnel insulating film at a lower portion of the trench section, and so as to make the tunnel insulating film exposed at an upper portion of the trench section; forming a trap layer and a top insulating film sequentially on the first conductive layer, and in contact with the upper portion of the trench section; removing the trap layer and the top insulating film formed on the first conductive layer at a center portion of the trench section in the width direction; forming a second conductive layer on the first conductive layer at the center portion of the trench section in the width direction and on the top insulating film; and forming a gate electrode from the first conductive layer and the second conductive layer. When separating the trap layer in the trench section, since the trap layer is not exposed to etching, the incidence of damage to the trap layer can be prevented.

DETAILED DESCRIPTION OF THE INVENTION

Figure 1A:
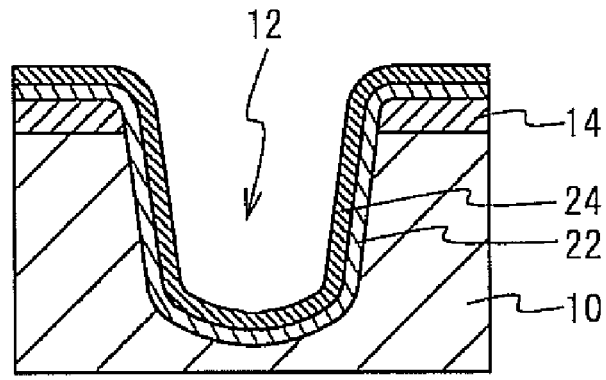
FIG. 1A, 1B, and FIG. 1C are cross-sectional views showing a process for manufacturing a semiconductor device according to Japanese Translation No. 2005-517301 of PCT International Application.
Figure 1B:
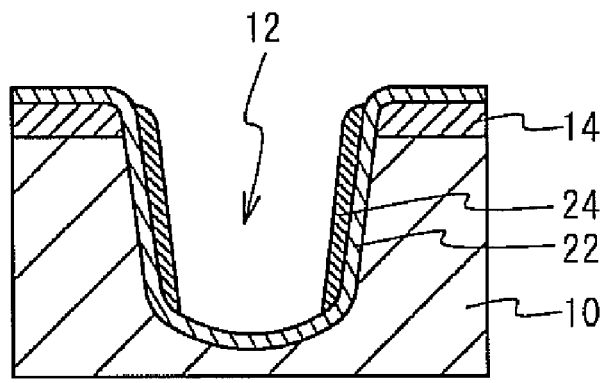
Figure 1C:
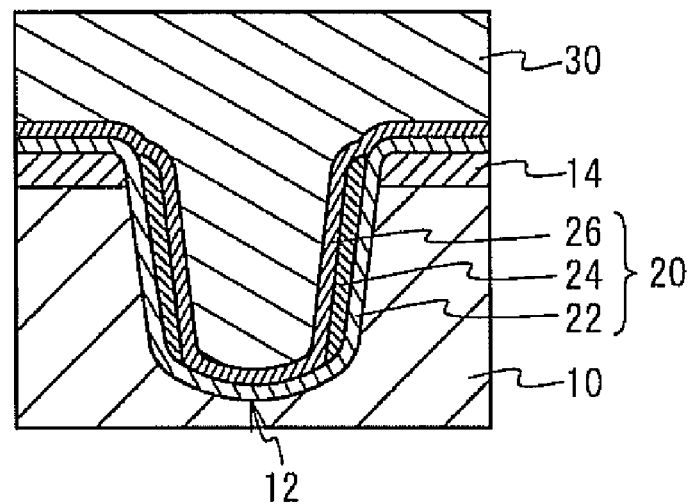

FIG. 1A to FIG. 1C are cross-sectional views showing as a comparative example a method for manufacturing a flash memory described in Japanese Translation No. 2005-517301 of PCT International Application. With reference to FIG. 1A, a diffusion region 14 that serves as a bit line is formed in a semiconductor substrate 10. A trench section 12 is formed in the semiconductor substrate 10. Accordingly, the trench section 12 is formed in between thus divided diffusion regions 14. On an inner surface of the trench section 12 and on the semiconductor substrate 10, a tunnel insulating film 22 and a trap layer 24 are formed. With reference to FIG. 1B, by anisotropically etching the trap layer 24, the trap layer 24 on the semiconductor substrate 10 and on a bottom portion of the trench section 12 is removed, whereby the trap layer 24 remains on both side faces of the trench section 12. With reference to FIG. 1C, a top insulating film 26 is formed in the trench section 12 and on the semiconductor substrate 10. Accordingly, an ONO film 20 is formed on both side faces of the trench section 12. A word line 30 that serves also as a gate electrode is formed so as to be embedded in the trench section 12.

According to the comparative example, since the trap layer 24 is removed from the bottom portion of the trench section 12, electric charges can be prevented from accumulating in the trap layer 24 at the bottom portion of the trench section 12 where an inner surface is curved.

However, in the comparative example, the trap layer 24 is anisotropically etched as shown in FIG. 1B. Thus, possible damage is inflicted on the trap layer 24.

Hereinafter, embodiments according to the present invention that solve the problems described above will be described.

First Embodiment

Figure 2:
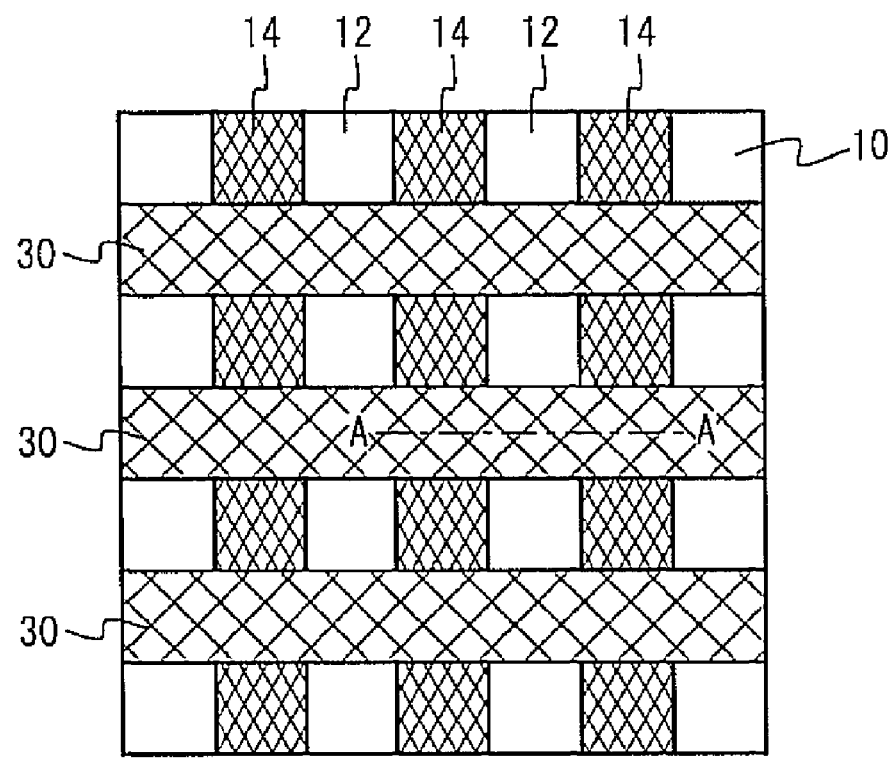
FIG. 2 is a top view of a flash memory according to a first embodiment of the present invention.

FIG. 2 is a plan view (showing a bit line, a trench section, and a word line) of a flash memory according to a first embodiment of the present invention. The diffusion region 14 that serves as the bit line is provided in the semiconductor substrate 10. The trench section 12 is formed in the semiconductor substrate 10 in between the diffusion regions 14. The word line 30 extends on the semiconductor substrate 10 so as to intersect an extending direction of the diffusion region 14.

Figure 3A:
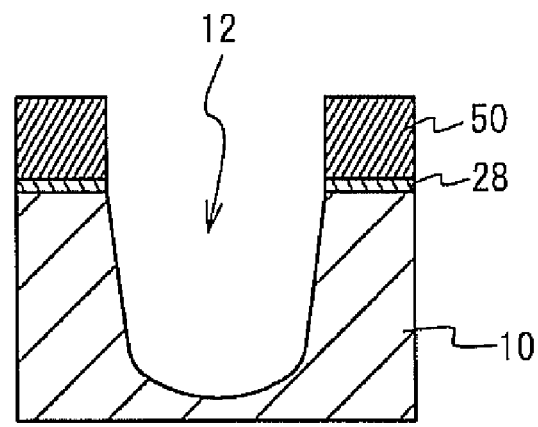
FIGS. 3A, 3B, and 3C are cross sectional views (part 1) showing a process for manufacturing a flash memory according to the first embodiment, and correspond to the cross section A-A of FIG. 2.

With reference to FIG. 3A to FIG. 6, a method for manufacturing a flash memory according to the first embodiment will be explained. With reference to FIG. 3A, for example, a silicon oxide film 28 having a film thickness of about 5 nm is formed on a p-type silicon semiconductor substrate (or a p-type region in the semiconductor substrate). A first mask layer 50 made of, for example, a silicon nitride film having a film thickness of about 100 nm is formed on the silicon oxide film 28 by chemical vapor deposition (CVD). An opening portion having a width of, for example, about 120 nm is formed on the first mask layer 50. Using the first mask layer 50 as a mask, the silicon oxide film 28 and the semiconductor substrate 10 are etched. Accordingly, for example, the trench section 12 having a depth of 100 nm and having a shape of U is formed in the semiconductor substrate 10.

Figure 3B:
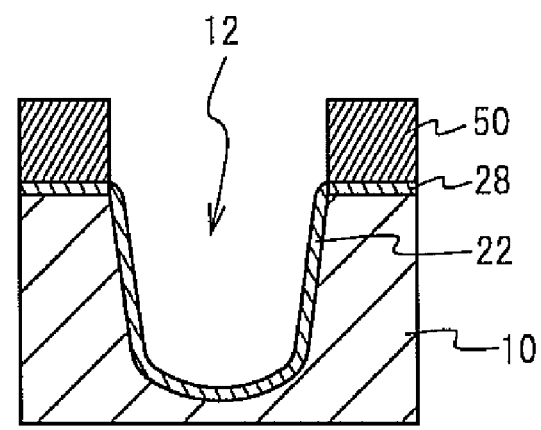
Figure 3C:
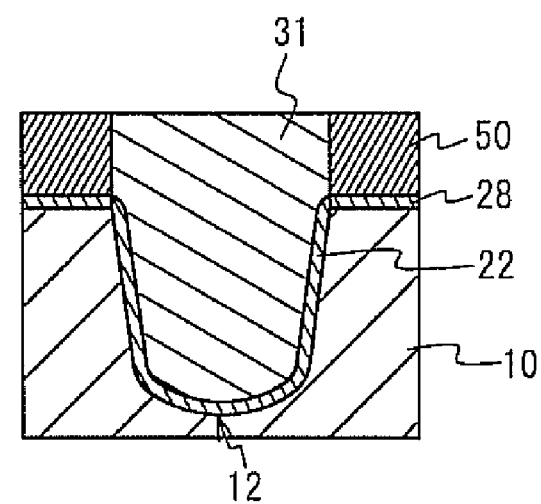

With reference to FIG. 3B, by using a thermal oxidation method, the tunnel insulating film 22 made of a silicon oxide film having a film thickness of about 5 nm is formed so as to cover an inner surface of the trench section 12. With reference to FIG. 3C, so as to be embedded in the trench section 12 and the opening portion of the first mask layer 50, a third conductive layer 31 made of an amorphous silicon film (or a polysilicon film) and having a film thickness of about 100 nm is formed on the first mask layer 50. By using chemical mechanical polish (CMP), the third conductive layer 31 is polished so as to expose the upper surface of the first mask layer 50. Accordingly, the third conductive layer 31 is embedded in the trench section 12 and in the opening portion of the first mask layer 50, whereby the upper surfaces of the first mask layer 50 and the third conductive layer 31 become flat.

Figure 4A:
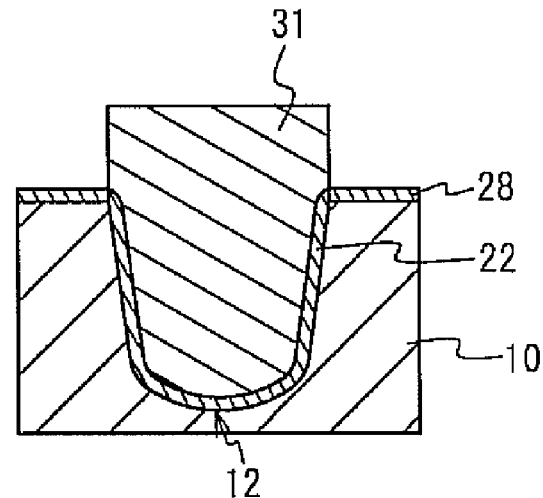
FIGS. 4A, 4B, and 4C are cross sectional views (part 2) showing the process for manufacturing a flash memory according to the first embodiment (part 2), and correspond to the cross section A-A of FIG. 2.
Figure 4B:
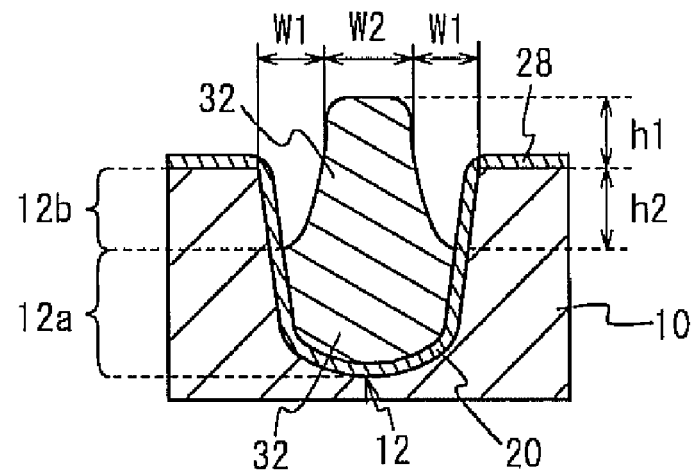

With reference to FIG. 4A, the first mask layer 50 is removed by using phosphoric acid or the like. With reference to FIG. 4B, the third conductive film 31 is isotropically etched for about 40 nm. As for the isotropic etching process, wet etching that uses an $HNO_3$ solution containing 0.5% of HF may be used for example. In this etching method, the etching rate of the amorphous silicon film is about 250 nm/min. Also, as for the isotropic etching process, dry etching that uses $CF_4$ and $O_2$ may be used. In this etching method, the etching rate of the amorphous silicon film is about 400 nm/min. In either of the etching methods, selectivity of amorphous silicon with respect to a silicon oxide ($SiO_2$) film can be made to 40 or more. Accordingly, the tunnel insulating film 22 is hardly etched, and the third conductive film 31 can be isotropically etched. During this etching process, since the semiconductor substrate 10 is covered with the silicon oxide film 28 and the tunnel insulating film 22, only the third conductive film 31 made of silicon is etched, and the semiconductor substrate 10 is not etched.

According to the above etching process, an upper surface 62 of the third conductive layer 31 is etched for about 40 nm, whereby a height h1 from the upper surface of the semiconductor substrate 10 to the upper surface 62 of the third conductive layer 31 becomes about 60 nm. On side faces of the trench section 12, the third conductive layer 31 is etched for about 40 nm, resulting in a thickness h2, and both sides of the third conductive film 31 are etched for about 40 nm, resulting in a width w1. Accordingly, the width w2 of a protrusion of the third conductive layer 31 becomes about 40 nm. By isotropically etching the third conductive layer 31 in this way, a first conductive layer 32 is formed. The first conductive layer 32 is formed in the trench section 12 so as to have an upper surface at the center portion of the trench section 12 in the width direction being higher than the upper surface of the semiconductor substrate 10, so as to be in contact with the tunnel insulating film 22 at a lower portion 12a of the trench section 12, and so as to make the tunnel insulating film 22 remain uncovered at an upper portion 12b of the trench section 12.

Figure 4C:
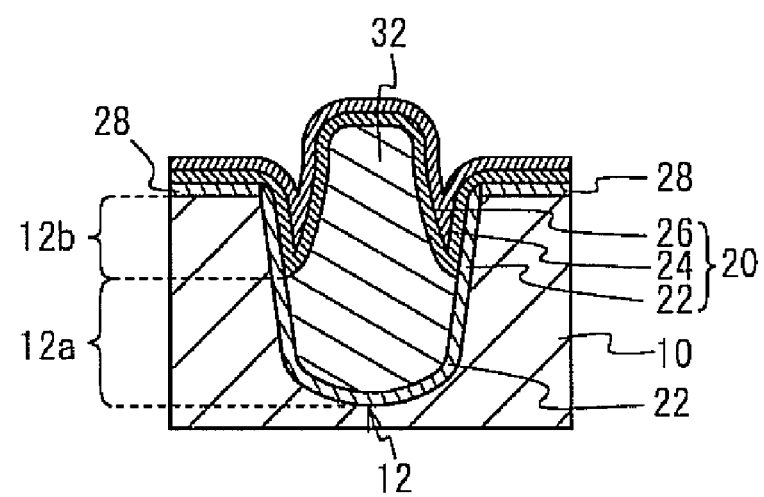

With reference to FIG. 4C, on the first conductive layer 32, on the upper portion 12b of the trench section 12, and on the semiconductor substrate 10, the trap layer 24 made of a silicon nitride film and having a film thickness of about 5 nm and the top insulating film 26 made of a silicon oxide film and having a film thickness of about 10 nm are formed. Thus, the trap layer 24 and the top insulating film 26 are sequentially formed in the upper portion 12b of the trench section 12 via and in contact with the tunnel insulating film 22 and also on the first conductive layer 32. Consequently, on both sides of the upper portion 12b of the trench section 12, the ONO film 20 composed of the tunnel insulating film 22, the trap layer 24, and the top insulating film 26 is formed.

Figure 5A:
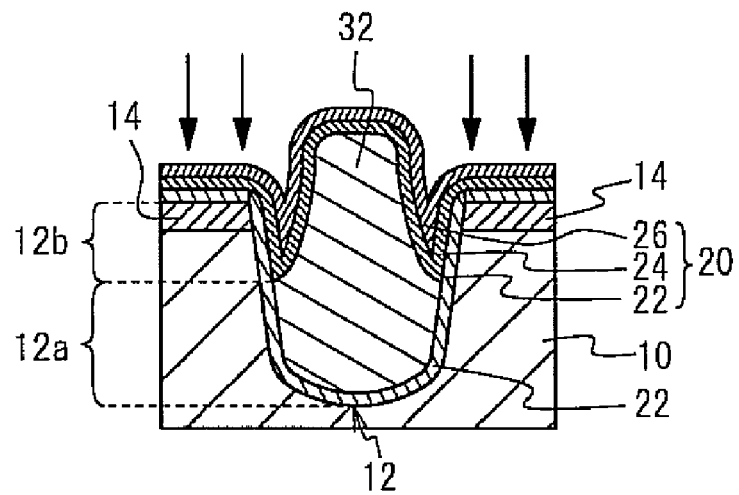
FIGS. 5A, 5B, and 5C are cross-sectional views (part 3) showing the process for manufacturing a flash memory according to the first embodiment, and correspond to the cross section A-A of FIG. 2.

With reference to FIG. 5A, for example, as the arrows show, arsenic is ion implanted under a condition where the implanting energy is 50 keV and the dose amount is $2\times10^{15}$ cm$^{-3}$. Accordingly, an n-type diffusion region 14 having a depth of about 15 nm is formed in the semiconductor substrate 10 on both sides of the trench section 12. The n-type diffusion region 14 is a bit line, and extends in an extending direction of the trench section 12 as shown in FIG. 2. The width of the diffusion region 14 is 70 nm for example. Moreover, heat treatment for forming the diffusion region 14 is preferably performed at or under 900° C. for suppressing the diffusion of arsenic.

Figure 5B:
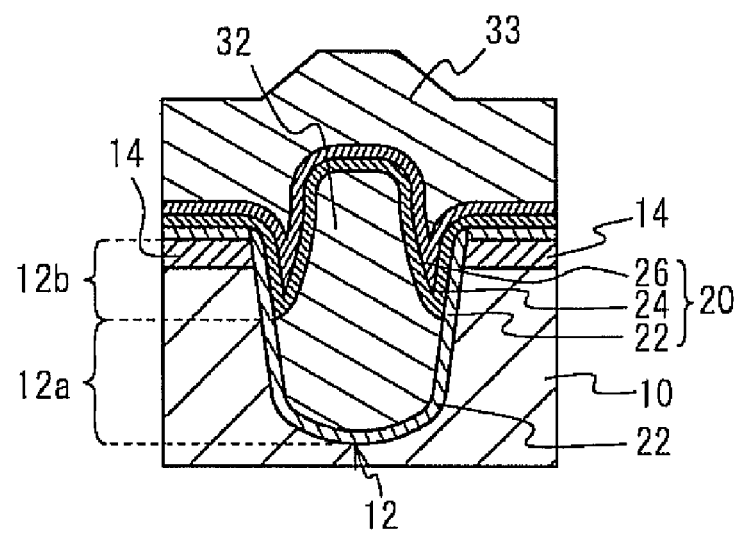
Figure 5C:
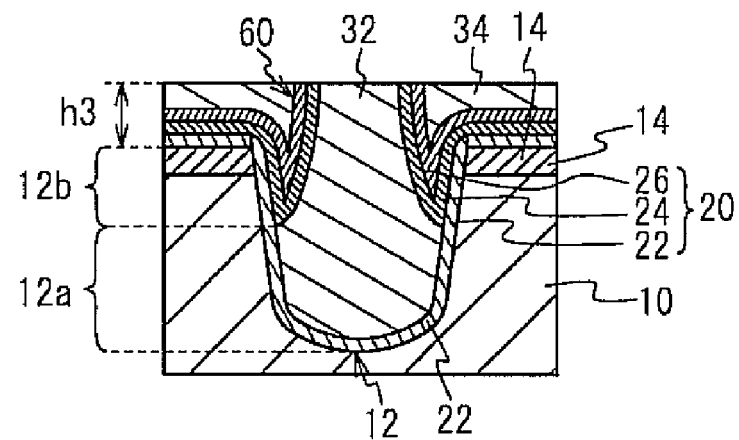

With reference to FIG. 5B, a fourth conductive layer 33 made of an amorphous silicon film having, for example, a film thickness of about 100 nm is formed on the top insulating film 26. With reference to FIG. 5C, the fourth conductive layer 33 is polished using CMP. Polishing of the fourth conductive layer 33 is, at first, performed by rendering as an end point the top insulating film 26 and the trap layer 24 on the upper surface of the first conductive layer 32. Next, the first conductive layer 32 and the fourth conductive layer 33 are polished for about 30 nm. Accordingly, the trap layer 24 and the top insulating film 26 at the center portion of the trench section 12 in the width direction are removed. Also, the height h3 from the semiconductor substrate 10 becomes about 30 nm, and the top surfaces of the first conductive layer 32 and the fourth conductive layer 34 become flat. Also, in between the first conductive layer 32 and the fourth conductive layer 34, a protrusion 60 composed of the trap layer 24 and the top insulating film 26 is formed.

Figure 6:
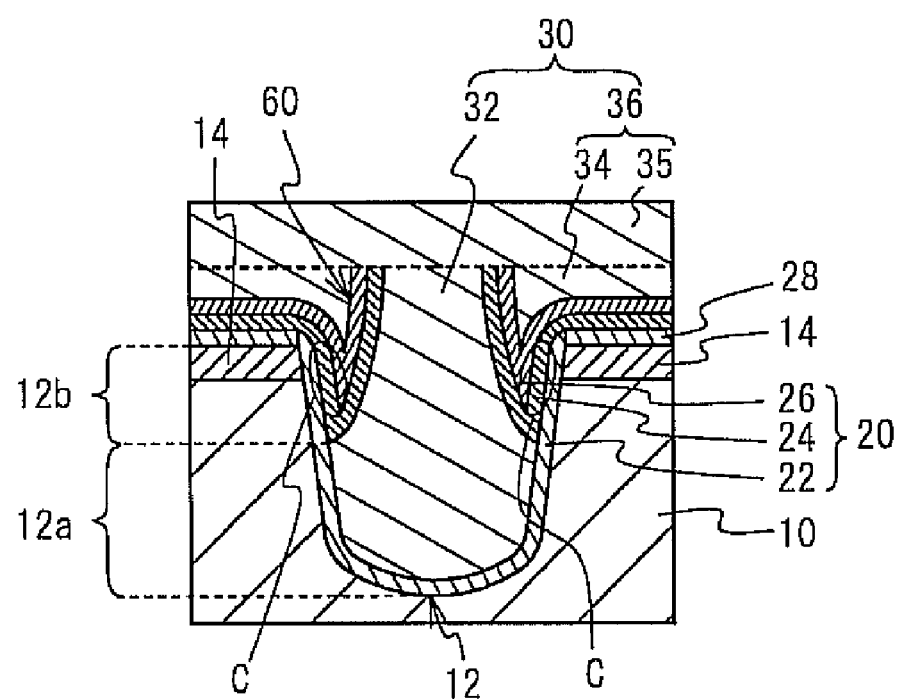
FIG. 6 is a cross-sectional view (part 4) showing the process for manufacturing a flash memory according to the first embodiment, and corresponds to the cross section A-A of FIG. 2.

With reference to FIG. 6, on the first conductive layer 32 and the fourth conductive layer 34, a fifth conductive layer 35 made of a polysilicon film and having a film thickness of about 200 nm is formed. Accordingly, a second conductive layer 36 composed of the fourth conductive layer 34 and the fifth conductive layer 35 is formed. The second conductive layer 36 is formed so as to contact on the first conductive layer 32 at the center portion of the trench section 12 in the width direction, the side of the top insulating film 26 formed on both sides of the upper portion 12b of the trench section 12, and on the top insulating film 26 serving as the protrusion 60.

With reference to FIG. 2, by etching the second conductive layer 36 and the first conductive layer 32, the word line 30 that intersects the diffusion region 14 that is the bit line is formed out of the second conductive layer 36 and the first conductive layer 32. The width of the word line 30 is, for example, 80 nm, and a distance between the word lines 30 is, for example, 40 nm. The word line 30 serves also as a gate electrode. That is, in the trench section 12 of FIG. 6, the word line 30 functions as a gate electrode.

In the first embodiment, as shown in FIG. 4B, the first conductive layer 32 is formed in the trench section 12 so as to be in contact with the tunnel insulating film 22 in the lower portion 12a of the trench section, and so that the tunnel insulating film 22 is exposed on the upper portion 12b of the trench section. As in FIG. 4C, the trap layer 24 and the top insulating film 26 are sequentially formed being in contact with the upper portion 12b of the trench section and on the first conductive layer 32. With reference to FIG. 5C, the trap layer 24 and the top insulating film 26 formed on the first conductive layer 32 are removed at the center portion of the trench section 12 in the width direction. As in FIG. 6, the second conductive layer 36 is formed on the first conductive layer 32 and the top insulating film 26 at the center portion of the trench section 12 in the width direction. As in FIG. 2, the word line 30 is formed out of the first conductive layer 32 and the second conductive layer 36.

In such process, as in FIG. 6, the trap layer 24 is provided in contact with the tunnel insulating film 22 on an inner surface of both sides of the upper portion 12b of the trench section, and the top insulating film 26 is provided in contact with the trap layer 24. Thereby, one bit can be stored in each ONO film 20 provided on an inner surface of both sides of the upper portion 12b of the trench section. On the other hand, the tunnel insulating film 22 is provided in the inner surface of the lower portion 12a of the trench section, and the trap layer 24 and the top insulating film 26 are not provided. Thus, the CBD between bits can be suppressed. Further, when separating the trap layer 24 within the trench section 12, since the trap layer 24 is not exposed to etching, the trap layer 24 can be prevented from being introduced with damage.

Also, as shown in FIG. 5B, on the top insulating film 26 formed on the first conductive layer 32, the fourth conductive layer 33 to be polished to serve as the fourth conductive layer 34 is formed. As shown in FIG. 5C, by polishing the fourth conductive layer 34, the trap layer 24 and the top insulating film 26 in the center portion of the trench section 12 in the width direction, and the first conductive layer 32 at the center portion of the trench section 12 in the width direction, the trap layer 24 and the top insulating film 26 in the center portion of the trench section 12 in the width direction are removed. As described above, since the trap layer 24 and the top insulating film 26 are not exposed to etching, the trap layer 24 can be prevented from being exposed to damage.

As shown in FIG. 4B, the first conductive layer 32 is formed so as to have the upper surface being higher than the upper surface of the semiconductor substrate 10 at the center portion of the trench section 12 in the width direction. Accordingly, as in FIG. 5C, the trap layer 24 formed on the first conductive layer 32 can be separated by the polishing of the first conductive layer 32.

As in FIG. 4A, the third conductive layer 31 is formed so as to be in contact with the entire tunnel insulating film 22 in the trench section 12, and so as to be higher than the upper surface of the semiconductor substrate 10. As in FIG. 4B, the third conductive layer 31 is isotropically etched. Accordingly, the first conductive layer 32 can be formed in the trench section 12 so as to have the upper surface being higher than the upper surface of the semiconductor substrate 10, so as to be in contact with the tunnel insulating film 22 at the lower portion 12a of the trench section 12, and so as to make the tunnel insulating film 22 exposed at the upper portion 12b of the trench section 12.

As in FIG. 6, by forming the fifth conductive layer 35 on the first conductive layer 32 and on the fourth conductive layer 34, the second conductive layer 36 can be formed.

In the flash memory according to the first embodiment manufactured by the above method, the word line 30 that serves as a gate electrode is provided so as to be in contact with the tunnel insulating film 22 at the lower portion 12a of the trench section, and so as to be in contact with the top insulating film 26 at the upper portion 12b of the trench section. Also, the trap layer 24 and the top insulating film 26, in between the lower portion 12a of the trench section and the upper portion 12b of the trench section, extend and protrude from both sides of the trench section 12 so as to be embedded in the word line 30 that serves also as a gate electrode.

Further, the protruding trap layer 24 and top insulating film 26 protrude upwardly from the side face of the trench section 12.

Second Embodiment

Figure 7A:
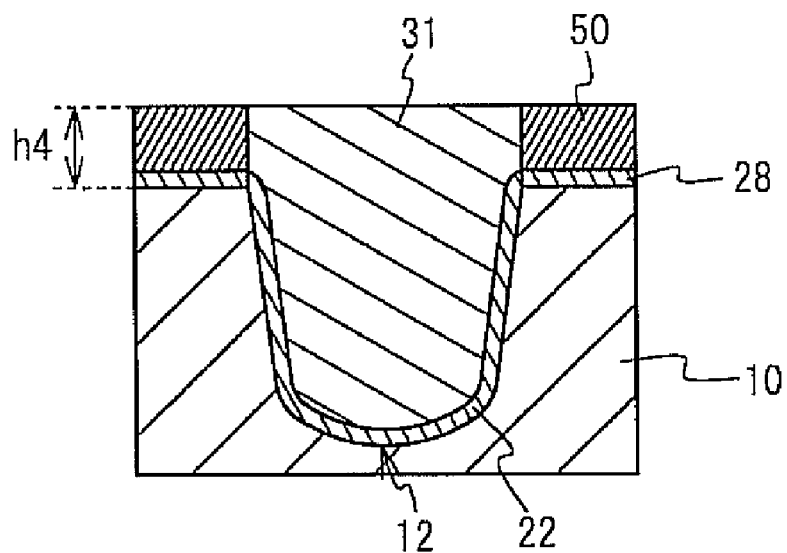
FIG. 7A and FIG. 7B are cross sectional views (part 1) showing a process for manufacturing a flash memory according to a second embodiment of the present invention, and correspond to the cross section A-A of FIG. 2.
Figure 7B:
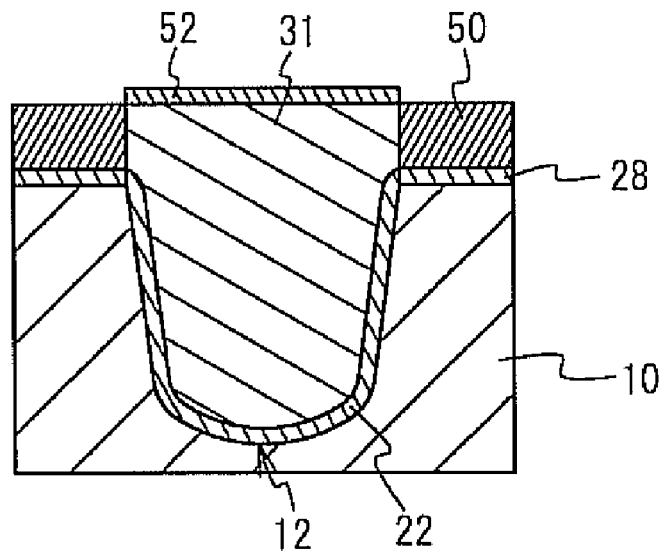

A second embodiment of the present invention is an example of using a second mask layer when forming the first conductive layer 32. With reference to FIG. 7A to FIG. 8B, a method for manufacturing a flash memory according to the second embodiment is explained. With reference to FIG. 7A, the process steps up to FIG. 3C of the first embodiment are performed. The height h4 from the semiconductor device 10 to the upper surfaces of the first mask layer 50 and the third conductive layer 31 is about 50 nm. With reference to FIG. 7B, the top surface of the third conductive layer 31 is thermal oxidized, whereby the second mask layer 52 having a film thickness of about 20 nm is formed. At this time, the top surface of the first mask layer 50 that is a silicon oxide film is hardly oxidized. Accordingly, the second mask layer 52 can be selectively formed on the third conductive layer 31.

Figure 8A:
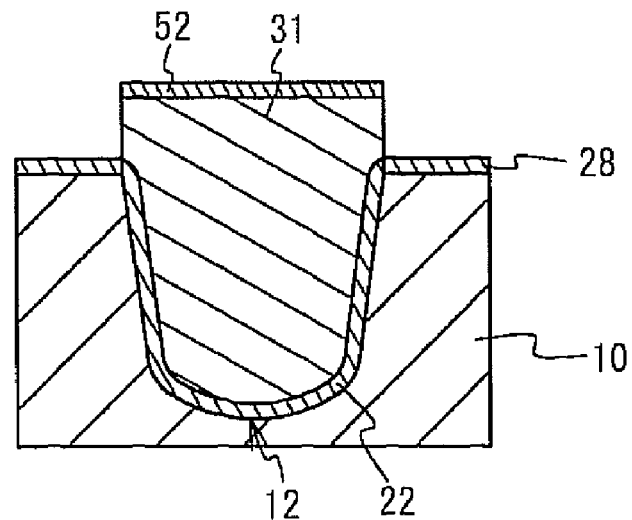
FIG. 8A and FIG. 8B are cross-sectional views (part 2) showing the process for manufacturing a flash memory according to the second embodiment, and correspond to the cross section A-A of FIG. 2.
Figure 8B:
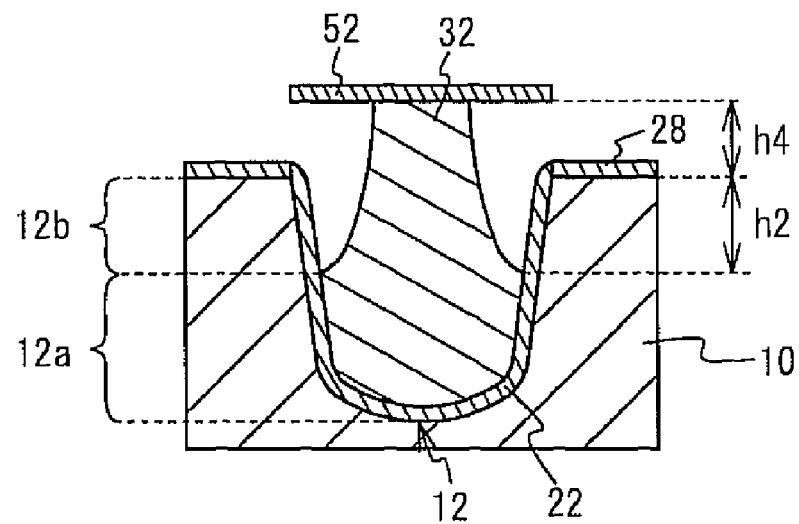

With reference to FIG. 8A, the first mask layer 50 is removed. With reference to FIG. 8B, the third conductive layer 31 is isotropically etched by using the second mask layer 52 as a mask. Accordingly, the first conductive layer 32 can be formed out of the third conductive layer 31. Thereafter, the second mask layer 52 is removed. The process steps from FIG. 4C to FIG. 6 of the first embodiment are performed subsequently. Accordingly to the above method, the flash memory according to the second embodiment is completed.

According to the second embodiment, as shown in FIG. 7B, the second mask layer 52 defined by the trench section 12 is formed on the third conductive layer 31. As shown in FIG. 8B, the first conductive layer 32 is formed by etching the third conductive layer 31 by using the second mask layer 52. Accordingly, since the height of the first conductive layer 32 is defined by the third conductive layer 31, the height h4 of the first conductive layer 32 and the height h2 of the upper portion 12b of the trench section can be controlled independently.

Third Embodiment

Figure 9A:
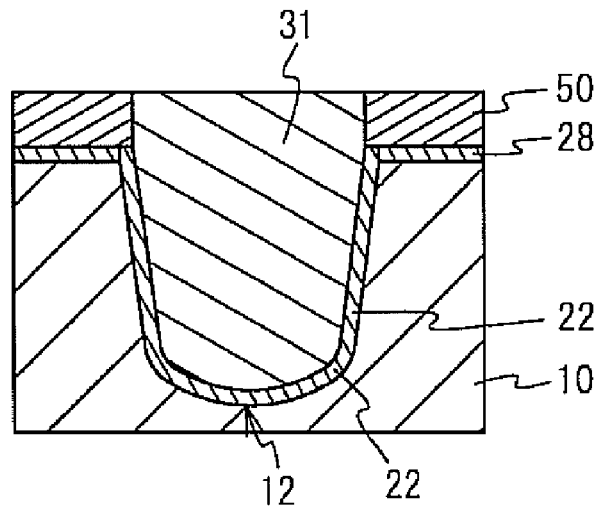
FIGS. 9A, 9B, and 9C are cross-sectional views (part 1) showing a process for manufacturing a flash memory according to a third embodiment of the present invention, and correspond to the cross section A-A of FIG. 2.

With reference to FIG. 9A to FIG. 11C, a process for manufacturing a flash memory according to a third embodiment of the present invention will be explained. With reference to FIG. 9A, the process steps from FIG. 3A to FIG. 3C of the first embodiment are performed. The film thickness of the first mask layer 50 is made to about 50 nm. With reference to FIG. 9B, the third conductive layer 31 is dry etched for about 100 nm. Accordingly, the third conductive layer 31 of the upper portion 12b of the trench section is removed, and the third conductive layer 31 remains in the lower portion 12a of the trench section, whereby a first conductive layer 32a is formed. The upper surface of the first conductive layer 32a is formed substantially horizontal with respect to the upper surface of the semiconductor substrate 10. With reference to FIG. 9C, the trap layer 24 and the top insulating film 26 are formed on the side of the tunnel insulating film 22 on both side faces of the trench section 12 and on the first conductive layer 32a.

Figure 10A:
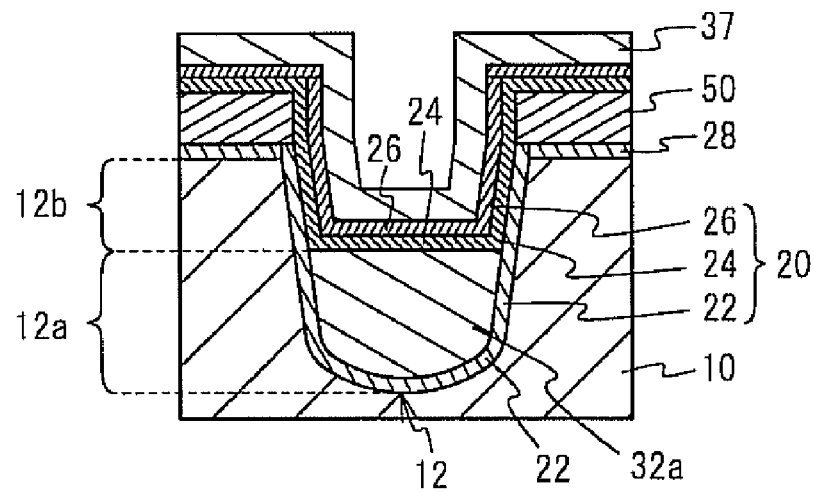
FIGS. 10A, 10B, and 10C are cross sectional views (part 2) showing the process for manufacturing a flash memory according to the third embodiment, and correspond to the cross section A-A of FIG. 2.
Figure 10B:
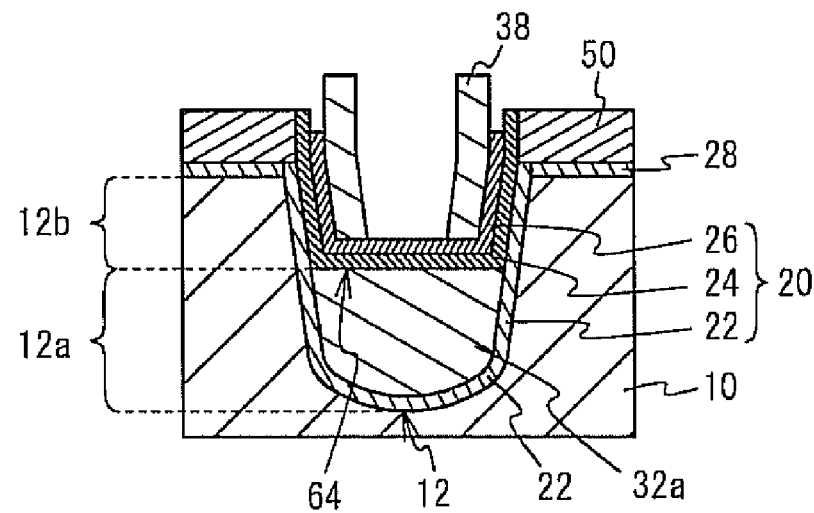
Figure 10C:
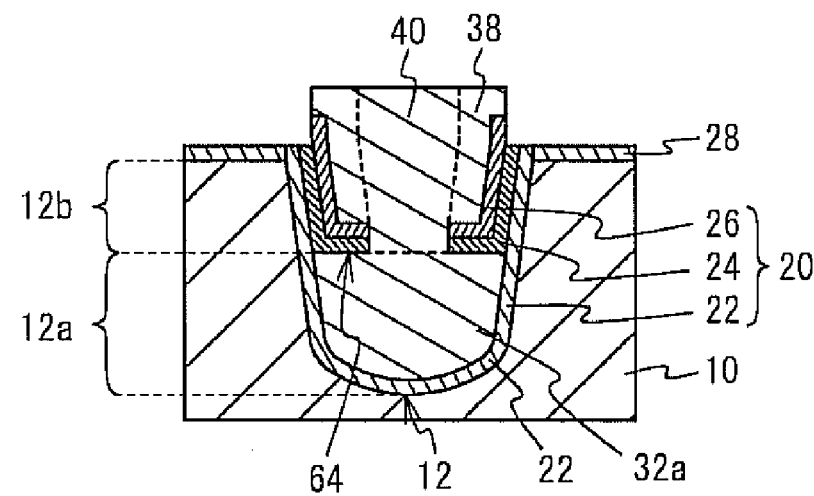

With reference to FIG. 10A, on the top insulating film 26, a conductive layer 37 made of amorphous silicon and having a film thickness of about 20 nm is formed. With reference to FIG. 10B, the conductive layer 37 is anisotropically etched, and a sixth conductive layer 38 is formed as a side wall on both sides of the upper portion 12b of the trench section. With reference to FIG. 10C, by using the sixth conductive layer 38 as a mask, the trap layer 24 and the top insulating film 26 in the center portion of the trench section 12 in the width direction are removed. Accordingly, on the first conductive layer 32a, a protrusion 64 is formed from the trap layer 24 and the top insulating film 26. A seventh conductive layer 40 made of amorphous silicon is formed so as to be embedded in the space between the sixth conductive layers 38 and on the first mask layer 50. The seventh conductive layer 40 is polished by using CMP until the upper surface of the first mask layer 50 is exposed. The first mask layer 50 is removed by using phosphoric acid or the like.

Figure 11A:
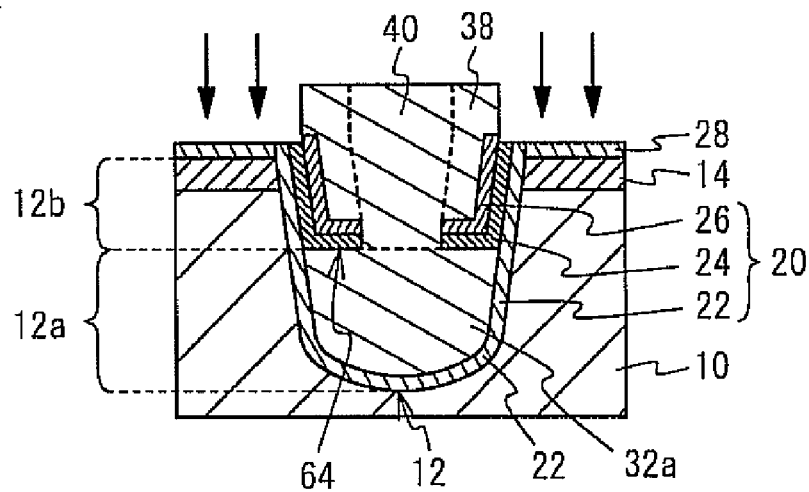
FIGS. 11A, 11B, and 11C are cross sectional views (part 3) showing the process for manufacturing a flash memory according to the third embodiment, and correspond to the cross section A-A of FIG. 2.
Figure 11B:
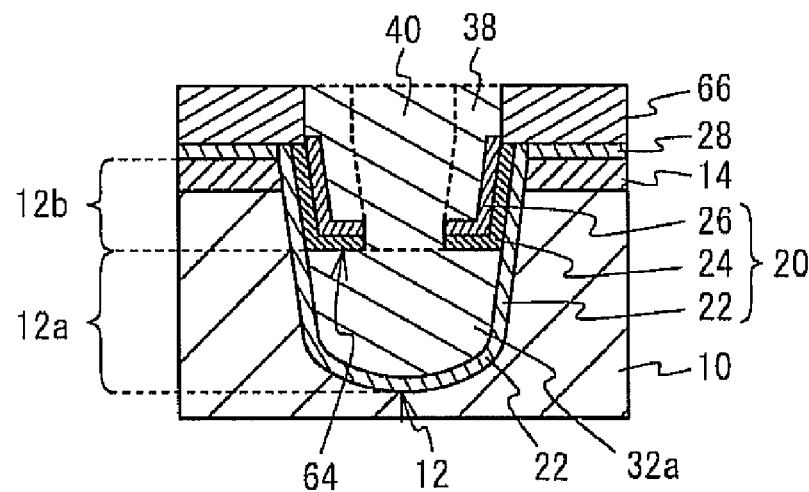
Figure 11C:
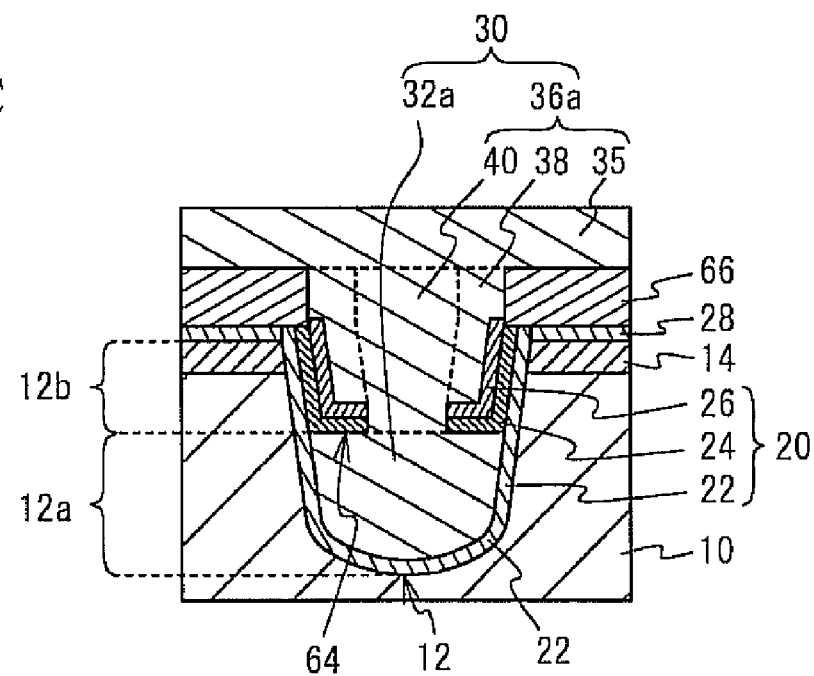

With reference to FIG. 11A, by using an ion implanting method as the arrows show, the diffusion region 14 that is a bit line is formed on both sides of the trench section 12. With reference to FIG. 11B, a silicon oxide film 66 is formed by using CVD on the sixth conductive layer 38, the seventh conductive layer 40 and the diffusion region 14. By using CMP, the silicon oxide film 66 is polished until the sixth conductive layer 38 and the seventh conductive layer 40 are exposed. With reference to FIG. 11C, the fifth conductive layer 35 made of polysilicon is formed on the sixth conductive layer 38, the seventh conductive layer 40, and the silicon oxide film 66. A second conductive layer 36a composed of the sixth conductive layer 38, the seventh conductive layer 40, and the fifth conductive layer 35 is formed. Similarly to the first embodiment, the second conductive layer 36a is formed so as to contact on the third conductive layer 31 at the center portion of the trench section 12 in the width direction, the side of the top insulating film 26 formed on the side face of the upper portion 12b of the trench section 12, and on the top insulating film 26 serving as the protrusion 64. The word line 30 that intersects the bit line is formed out of the first conductive layer 32a and the second conductive layer 36a. Accordingly, a flash memory according to the third embodiment is completed.

According to such process, as in FIG. 11C, the trap layer 24 is provided in contact with the tunnel insulating film 22 in an inner surface on both sides of the upper portion 12b of the trench section. Thus, one bit each can be stored in the ONO film 20 provided in the inner surface on both sides of the upper portion 12b of the trench section. On the other hand, the tunnel insulating film 22 is provided in an inner surface of the lower portion 12a of the trench section, and the trap layer 24 and the top insulating film 26 are not provided there. Therefore, the CBD between bits can be suppressed. Further, as in FIG. 10B and FIG. 1C, when separating the trap layer 24 in the trench section 12, since the trap layer 24 is not exposed to etching, the trap layer 24 can be prevented from being exposed to damage.

Figure 9B:
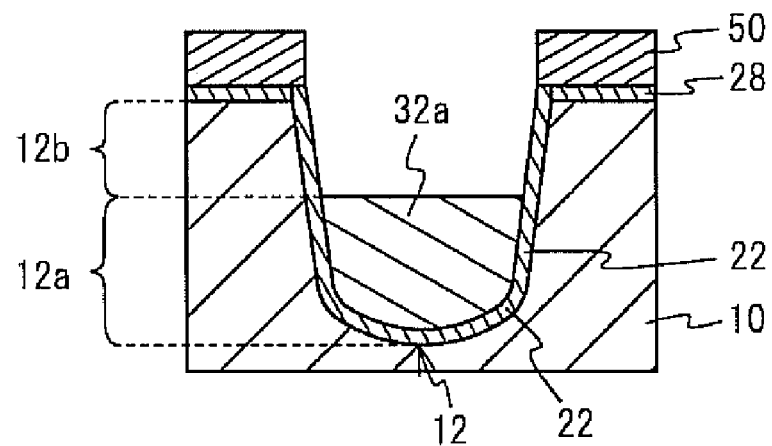
Figure 9C:
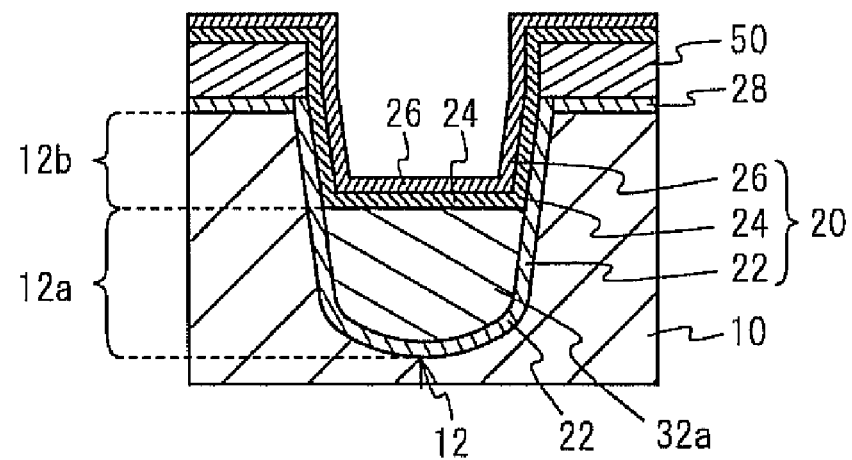

In the third embodiment, unlike the first embodiment, as shown in FIG. 9B, the first conductive layer 32a is formed so that the upper surface of the first conductive layer 32a becomes lower than the upper surface of the semiconductor substrate 10. Thus, as in the first embodiment, it is difficult to remove the trap layer 24 and the top insulating film 26 at the center portion of the trench section 12 by polishing. Thus, as in FIG. 10B, the sixth conductive layer 38 is formed as a side wall of the top insulating film 26 provided on both sides of the trench section 12 of the upper portion 12b of the trench section. As shown in FIG. 10C, by using the sixth conductive layer 38 as a mask, the trap layer 24 and the top insulating film 26 at the center portion of the trench section 12 in the width direction are removed. Accordingly, since the etching is performed in a state where the sixth conductive layer 38 is in contact with the top insulating film 26, the trap layer 24 can be prevented from being introduced with damage.

Also, as in FIG. 10C, the seventh conductive layer 40 is formed in between the sixth conductive layers 38. As in FIG. 11C, by forming the fifth conductive layer 35 on the sixth conductive layer 38 and the seventh conductive layer 40, the second conductive layer 36a composed of the sixth conductive layer 38, the seventh conductive layer 40, and the fifth conductive layer 35 is formed. In this manner, by not removing the sixth conductive layer 38 used as a mask in FIG. 10C and rendering the layer to be a part of a gate electrode, the trap layer 24 and the top insulating film 26 are protected by the sixth conductive layer 38 also in the process steps after FIG. 10C. Thereby, the trap layer 24 can be prevented from being exposed to damage.

By a flash memory according to the third embodiment, unlike the first embodiment, the trap layer 24 and the top insulating film 26 protruding toward the gate electrode protrude horizontally with respect to the upper surface of the semiconductor substrate 10 from the side face of the trench section 12.

Fourth Embodiment

A fourth embodiment of the present invention is an example of forming the trench section and an isolation trench at the same time. With reference to FIG. 12A to FIG. 14B, a method for manufacturing a flash memory according to the fourth embodiment will be explained. In the drawing, the right side shows a memory cell region 80 and the left side shows a periphery of the isolation region in the peripheral region 70. Moreover, the peripheral region 70 is a region where a peripheral circuit for performing, for example, writing or deleting data to or from the memory cell is formed. The peripheral circuit is structured by a MOS transistor.

Figure 12A:
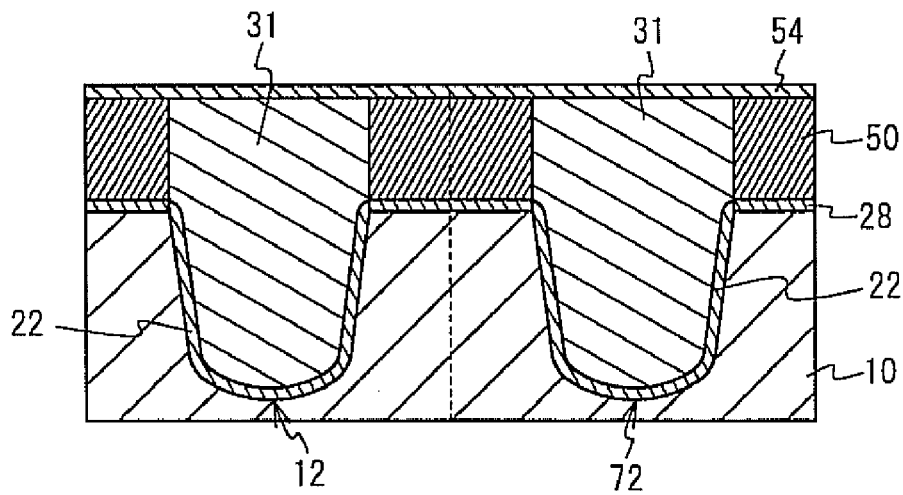
FIGS. 12A, 12B, and 12C are cross sectional views (part 1) showing a process for manufacturing a flash memory according to a fourth embodiment of the present invention, and correspond to the cross section A-A of FIG. 2.
Figure 12B:
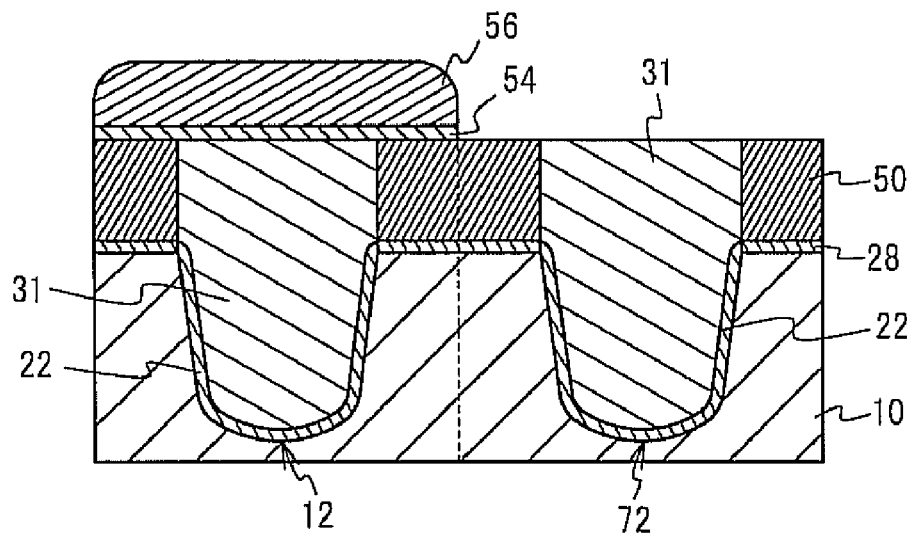
Figure 12C:
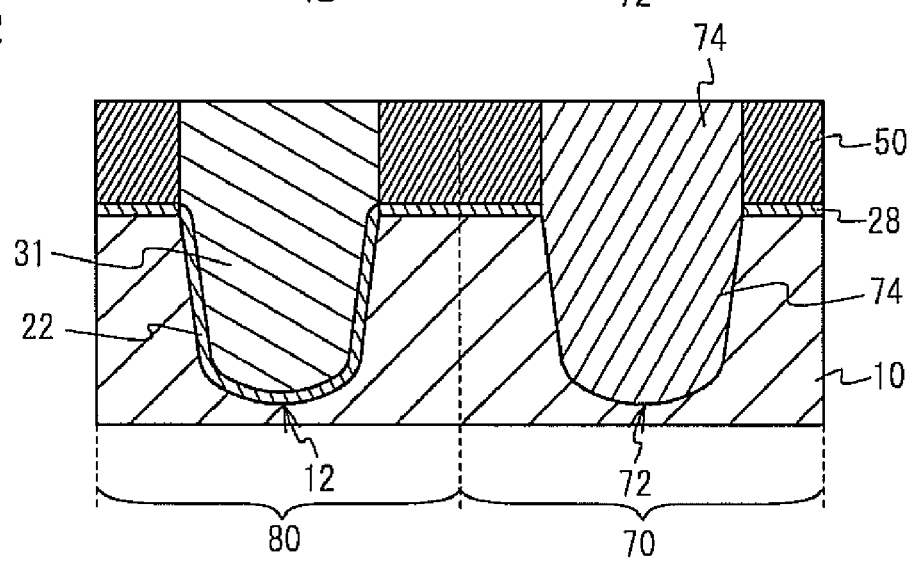

With reference to FIG. 12A, the process steps up to FIG. 3C in the first embodiment are performed. At this time, simultaneously with the forming of the trench section 12 in the memory cell region 80 by using the first mask layer 50 as a mask, an isolation trench 72 is formed in the peripheral region 70 by using the first mask layer 50 as a mask. The isolation trench 72 is a trench for isolating MOS transistors configuring the peripheral circuit. The third conductive layer 31 is simultaneously formed in the trench section 12 and in the isolation trench 72. On the first mask layer 50 and on the third conductive layer 31, for example, a silicon oxide film 54 having a film thickness of about 10 nm is formed by using CVD. With reference to FIG. 12B, a photoresist 56 is formed on the memory cell region 80, and the silicon oxide film 54 in the peripheral region is removed. With reference to FIG. 12C, in the peripheral region 70, the third conductive layer 31 and the tunnel insulating film 22 in the isolation trench 72 are selectively removed. The photoresist 56 and the silicon oxide film 54 are removed. A silicon oxide film is formed on the first mask layer 50 and on the third conductive layer 31 so as to be embedded in the isolation trench 72. By using CMP, the silicon oxide film is polished so that the upper surfaces of the first mask layer 50 and the third conductive layer 31 are exposed. Accordingly, the silicon oxide film is embedded in the isolation region 72, whereby an isolation insulating film 74 is formed.

Figure 13A:
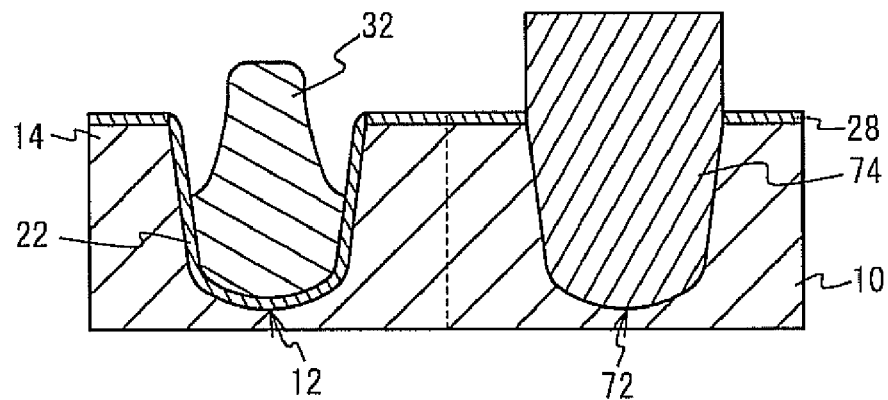
FIGS. 13A, 13B, and 13C are cross-sectional views (part 2) showing the process for manufacturing a flash memory according to the fourth embodiment, and correspond to the cross section A-A of FIG. 2.
Figure 13B:
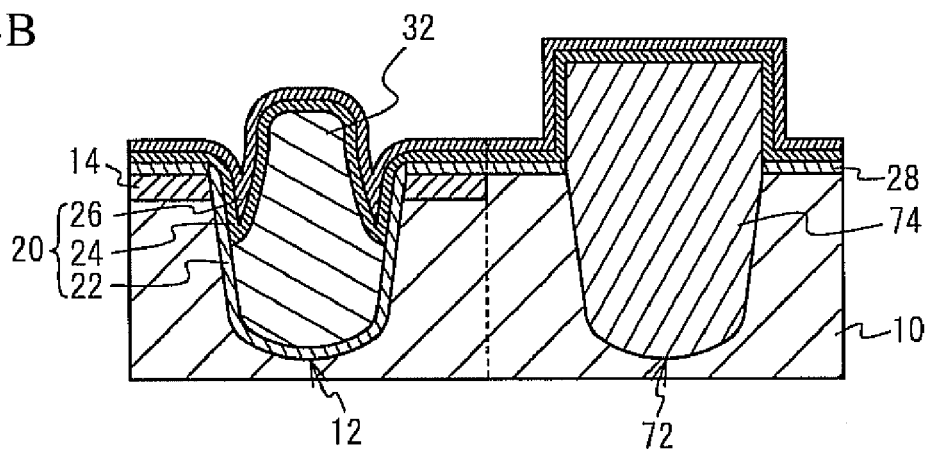
Figure 13C:
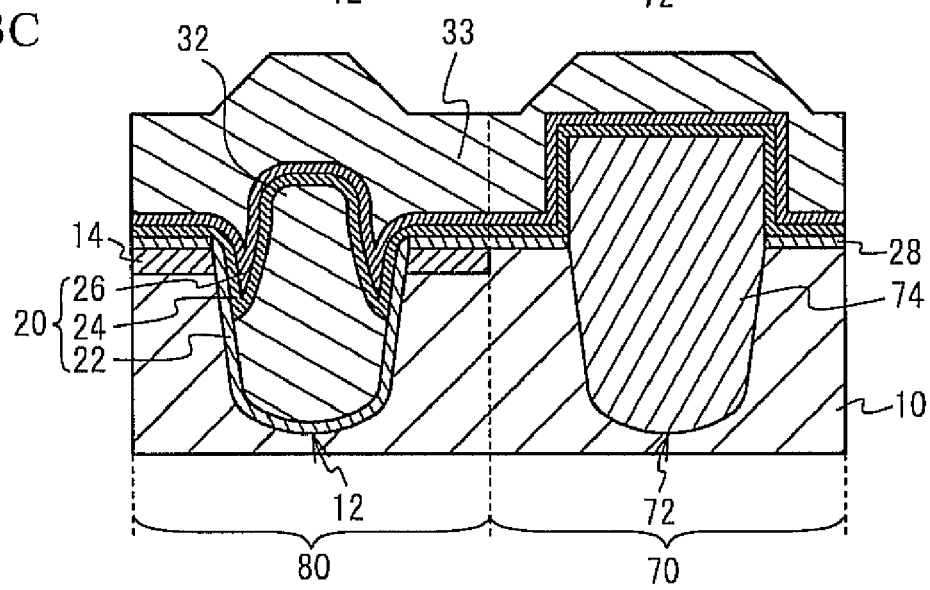

With reference to FIG. 13A, the first conductive layer 32 is formed out of the third conductive layer 31 by performing the process steps of FIG. 4A and FIG. 4B in the first embodiment. In a process step equivalent to that of FIG. 4B, since the semiconductor substrate 10 in the peripheral region 70 is covered by the silicon oxide film 28 and the isolating insulating film 74, only the third conductive layer 31 is etched. With reference to FIG. 13B, the process steps corresponding to FIG. 4C and FIG. 5A are performed, whereby the trap layer 24 and the top insulating film 26 are formed on the semiconductor substrate 10, the first conductive layer 32, and the isolating insulating film 74. In the memory cell region 80, the diffusion region 14 is formed in the semiconductor substrate 10 on both sides of the trench section 12. With reference to FIG. 13C, a process step corresponding to FIG. 5B is performed, whereby the fourth conductive layer 33 is formed on the top insulating film 26.

Figure 14A:
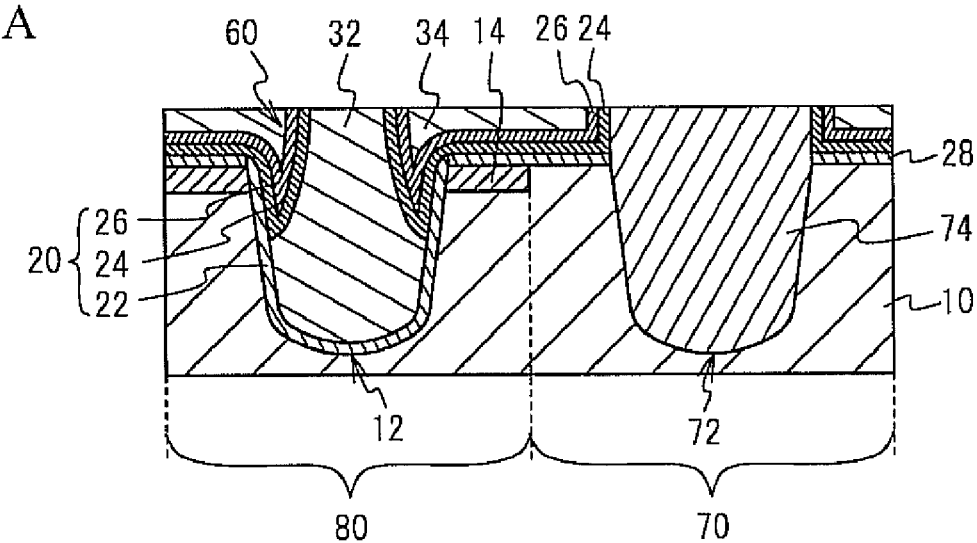
FIGS. 14A and 14B are cross sectional views (part 3) showing the process for manufacturing a flash memory according to the fourth embodiment, and correspond to the cross section A-A of FIG. 2.
Figure 14B:
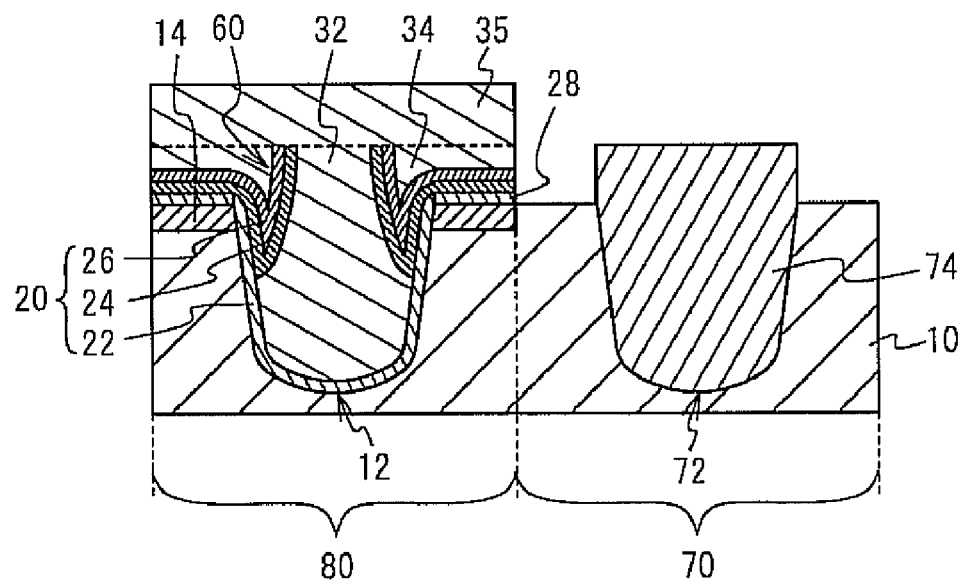

With reference to FIG. 14A, a process step corresponding to FIG. 5C is performed, and the fourth conductive layer 33 is polished. Accordingly, the fourth conductive layer 34 is formed out of the fourth conductive layer 33, whereby the protrusion 60 is formed in between the fourth conductive layer 34 and the first conductive layer 32. With reference to FIG. 14B, the fourth conductive layer 34, the top insulating film 26, and the trap layer 24 in the peripheral region 70 are selectively removed. In the peripheral region 70, a gate insulating film (not shown) is formed. In the memory cell region 80, a process step corresponding to FIG. 6 is performed, whereby the fifth conductive layer 35 is formed. At this time, in the peripheral region 70, the fifth conductive layer 35 that is to be a gate electrode is formed. In the memory cell region 80, simultaneously with the forming of the word line 30 that serves as a gate electrode, another gate electrode (not shown) is formed in the peripheral region. Thereafter, by performing a known process in the memory cell region 80 and the peripheral region 70, the flash memory according to the fourth embodiment is completed.

According to the fourth embodiment, the process step of forming the trench section 12 includes the process step of forming the isolation trench 72. Thus, the process steps of manufacturing the peripheral region 70 and the memory cell region 80 become consistent, whereby the process of manufacturing can be simplified.

Finally, several aspects of the present invention are summarized below.

According to an aspect of the present invention, there is provided a semiconductor device including: a semiconductor substrate provided with a trench section; a tunnel insulating film covering an inner surface of the trench section; a trap layer provided in contact with the tunnel insulating film on an inner surface of an upper portion of the trench section; a top insulating film provided in contact with the trap layer; and a gate electrode embedded in the trench section, and provided in contact with the tunnel insulating film at a lower portion of the trench section and in contact with the top insulating film at the upper portion of the trench section. The trap layer and the top insulating film, in between the lower portion of the trench section and the upper portion of the trench section, extend and protrude from both sides of the trench section so as to be embedded in the gate electrode. When manufacturing the semiconductor device according to the above aspects, since the trap layer is not exposed to etching for separating the trap layer in the trench section, the trap layer can be prevented from being exposed to damage.

In the above arrangement, the protruding trap layer and top insulating film may protrude upwardly from side faces of the trench section.

In the above arrangement, the protruding trap layer and top insulating film may protrude horizontally from the side faces of the trench section.

In the above arrangement, a diffusion region may be formed in the semiconductor substrate on both sides of the trench section.

According to another aspect of the present invention, there is provided a method for manufacturing a semiconductor device including: forming a trench section in a semiconductor substrate; forming a tunnel insulating film that covers an inner surface of the trench section; forming a first conductive layer in the trench section so as to be in contact with the tunnel insulating film at a lower portion of the trench section, and so as to make the tunnel insulating film exposed at an upper portion of the trench section; forming a trap layer and a top insulating film sequentially on the first conductive layer, and in contact with the upper portion of the trench section; removing the trap layer and the top insulating film formed on the first conductive layer at a center portion of the trench section in the width direction; forming a second conductive layer on the first conductive layer at the center portion of the trench section in the width direction and on the top insulating film; and forming a gate electrode from the first conductive layer and the second conductive layer. According to this aspect of the present invention, when separating the trap layer in the trench section, since the trap layer is not exposed to etching, the trap layer can be prevented from being exposed to damage.

In the above method, the forming of the first conductive layer may be forming the first conductive layer so that an upper surface of the first conductive layer becomes higher at the center portion of the trench section in the width direction than an upper surface of the semiconductor substrate.

The above method may further include forming a third conducive layer so as to be in contact with the entire tunnel insulating film in the trench section, and so as to be higher than the upper surface of the semiconductor substrate. The forming of the first conductive layer may include etching the third conductive layer.

In the above method, the etching of the third conductive layer may be through isotropically etching.

In the above method, the third conducive layer may be formed by using a first mask layer that is used to form the trench section.

The above method may further include forming a second mask layer defined by the trench section on the third conductive layer. The etching of the third conductive layer may be performed by etching using the second mask layer. By the above method, the height of the first conductive layer can be adjusted.

The above method may further include forming a fourth conductive layer on the top insulating film formed on the first conductive layer. The removing of the trap layer and the top insulating film at the center portion of the trench section in the width direction may include: polishing the fourth conductive layer, the trap layer and the top insulating film at the center portion of the trench section in the width direction, and the first conductive layer at the center portion of the trench section in the width direction. By the above method, since the trap layer is not exposed to etching, the trap layer can be prevented from being introduced with damage.

In the above method, the forming of the second conductive layer may include: forming a fifth conductive layer on the first conductive layer and the fourth conductive layer; and forming the second conductive layer out of the fourth conductive layer and the fifth conductive layer.

In the above method, the first conductive layer may be formed so that the upper surface of the first conductive layer becomes lower than the upper surface of the semiconductor substrate.

The above method may further include forming a sixth conductive layer on each side wall of the top insulating film provided on both sides of the trench section at the upper portion of the trench section. The removing of the trap layer and the top insulating film at the center portion of the trench section in the width direction may be performed by using the sixth conductive layer as a mask. By the above method, since the trap layer is not exposed to etching, the trap layer can be prevented from being exposed to damage.

The above method may further include forming a seventh conductive layer in between the sixth conductive layers. The forming of the second conductive layer may include: forming the fifth conductive layer on the sixth conductive layer and the seventh conductive layer; and forming the second conductive layer out of the sixth conductive layer, the seventh conductive layer, and the fifth conductive layer.

In the above method, the forming of the trench section may include forming an isolation trench. By the above method, the manufacturing process can be simplified.

While preferred embodiments of the present invention are described in detail above, the present invention is not limited to these specific embodiments and, within the spirit and scope of the present invention as defined in the appended claims, various modifications and alterations may be made.

What is claimed is:

1. A method for manufacturing a semiconductor device, the method comprising:
    forming a trench section in a semiconductor substrate;
    forming a tunnel insulating film that covers an inner surface of the trench section;
    forming a first conductive layer in the trench section so as to be in contact with the tunnel insulating film at a lower portion of the trench section, and so as to make the tunnel insulating film exposed at an upper portion of the trench section;
    forming a trap layer and a top insulating film sequentially on the first conductive layer, and in contact with the upper portion of the trench section;
    removing the trap layer and the top insulating film formed on the first conductive layer at a center portion of the trench section in the width direction;
    forming a second conductive layer on the first conductive layer at the center portion of the trench section in the width direction and on the top insulating film; and
    forming a gate electrode from the first conductive layer and the second conductive layer.

2. The method for manufacturing a semiconductor device according to claim 1, wherein the first conductive layer is formed so that an upper surface of the first conductive layer becomes higher at the center portion of the trench section in the width direction than an upper surface of the semiconductor substrate.

3. The method for manufacturing a semiconductor device according to claim 1, the method further comprising:
    forming a third conducive layer so as to be in contact with the entire tunnel insulating film in the trench section, and so as to be higher than the upper surface of the semiconductor substrate; wherein the forming of the first conductive layer comprises etching the third conductive layer.

4. The method for manufacturing a semiconductor device according to claim 3, wherein the etching of the third conductive layer may be through isotropical etching.

5. The method for manufacturing a semiconductor device according to claim 3, wherein the third conductive layer may be formed by using a first mask layer that is used to form the trench section.

6. The method for manufacturing a semiconductor device according to claim 3, the method further comprising:
    forming a second mask layer defined by the trench section on the third conductive layer.

7. The method for manufacturing a semiconductor device according to claim 6, wherein the etching of the third conductive layer may be performed by etching using the second mask layer.

8. The method for manufacturing a semiconductor device according to claim 1, the method further comprising:
forming a fourth conductive layer on the top insulating film formed on the first conductive layer; wherein removing the trap layer and the top insulating film at the center portion of the trench section in the width direction comprises polishing the fourth conductive layer, the trap layer and the top insulating film at the center portion of the trench section in the width direction, and the first conductive layer at the center portion of the trench section in the width direction.

9. The method for manufacturing a semiconductor device according to claim 8, wherein forming the second conductive layer comprises:
forming a fifth conductive layer on the first conductive layer and the fourth conductive layer; and
forming the second conductive layer out of the fourth conductive layer and the fifth conductive layer.

10. The method for manufacturing a semiconductor device according to claim 1, wherein the first conductive layer is formed so that the upper surface of the first conductive layer becomes lower than the upper surface of the semiconductor substrate.

11. The method for manufacturing a semiconductor device according to claim 10, the method further comprising:
forming a sixth conductive layer on each side wall of the top insulating film provided on both sides of the trench section at the upper portion of the trench section; wherein removing the trap layer and the top insulating film at the center portion of the trench section in the width direction comprises:
removing the trap layer and the top insulating film by using the sixth conductive layer as a mask.

12. The method for manufacturing a semiconductor device according to claim 11, further comprising:
forming a seventh conductive layer in between the sixth conductive layers; wherein the forming of the second conductive layer comprises:
forming the fifth conductive layer on the sixth conductive layer and the seventh conductive layer; and forming the second conductive layer out of the sixth conductive layer, the seventh conductive layer, and the fifth conductive layer.

13. The method for manufacturing a semiconductor device according to claim 1, further comprising:
forming an isolation trench in the semiconductor substrate.

* * * * *